US012308543B2

(12) United States Patent
Edwards, Jr. et al.

(10) Patent No.: US 12,308,543 B2
(45) Date of Patent: May 20, 2025

(54) STRUCTURE FOR OPTIMAL XPU SOCKET COMPRESSION

(71) Applicant: Google LLC, Mountain View, CA (US)

(72) Inventors: William F. Edwards, Jr., Livermore, CA (US); Xu Zuo, Saratoga, CA (US); Ryohei Urata, San Carlos, CA (US); Melanie Beauchemin, Mountain View, CA (US); Woon-Seong Kwon, Santa Clara, CA (US); Shinnosuke Yamamoto, San Francisco, CA (US); Houle Gan, Santa Clara, CA (US); Yujeong Shim, Cupertino, CA (US)

(73) Assignee: Google LLC, Mountain View, CA (US)

( * ) Notice: Subject to any disclaimer, the term of this patent is extended or adjusted under 35 U.S.C. 154(b) by 460 days.

(21) Appl. No.: 17/722,860

(22) Filed: Apr. 18, 2022

(65) Prior Publication Data

US 2023/0335928 A1    Oct. 19, 2023

(51) Int. Cl.
*H01R 12/00*  (2006.01)
*H01R 12/70*  (2011.01)
*H01R 13/533* (2006.01)
*H01R 13/66*  (2006.01)

(52) U.S. Cl.
CPC ....... *H01R 12/7064* (2013.01); *H01R 13/533* (2013.01); *H01R 13/6683* (2013.01)

(58) Field of Classification Search
CPC ............. H01R 12/7064; H01R 13/533; H01R 13/6683
See application file for complete search history.

(56) References Cited

U.S. PATENT DOCUMENTS

| 4,631,820 | A |   | 12/1986 | Harada et al. |
| 5,127,837 | A | * | 7/1992  | Shah .............. G01R 1/0408 |
|           |   |   |         | 439/700 |
| 5,175,613 | A |   | 12/1992 | Barker, III et al. |
| 5,497,031 | A |   | 3/1996  | Kozono |
| 5,608,262 | A |   | 3/1997  | Degani et al. |
| 5,886,408 | A |   | 3/1999  | Ohki et al. |
| 5,998,241 | A |   | 12/1999 | Niwa |
| 6,069,023 | A |   | 5/2000  | Bernier et al. |
| 6,154,371 | A |   | 11/2000 | Oba et al. |
| 6,297,964 | B1|   | 10/2001 | Hashimoto |

(Continued)

FOREIGN PATENT DOCUMENTS

| CN | 109618538 B | 10/2020 |
| DE | 19816794 A1 | 10/1999 |

(Continued)

OTHER PUBLICATIONS

Extended European Search Report for European Patent Application No. 22206410.7 dated Sep. 4, 2023. 9 pages.

(Continued)

*Primary Examiner* — Phuong Chi Thi Nguyen
(74) *Attorney, Agent, or Firm* — Lerner David LLP

(57) ABSTRACT

An assembly includes a printed circuit board ("PCB"). An aperture extends through the PCB. The assembly also includes an array of pins and a processor package. The array of pins extends around a perimeter of the aperture, and the processor package extends over the aperture. The processor package is pressed against the array of pins by a compressive force couple.

19 Claims, 5 Drawing Sheets

(56) References Cited

U.S. PATENT DOCUMENTS

| | | |
|---|---|---|
| 6,489,669 B2 | 12/2002 | Shimada et al. |
| 6,518,666 B1 | 2/2003 | Ikeda |
| 7,085,143 B1 | 8/2006 | Dyckman et al. |
| 7,180,165 B2 | 2/2007 | Ellsberry et al. |
| 7,247,932 B1 | 7/2007 | Lin et al. |
| 7,476,978 B2 | 1/2009 | Otremba |
| 7,773,390 B2 | 8/2010 | Weir et al. |
| 7,886,431 B2 | 2/2011 | Weir et al. |
| 8,426,888 B2 | 4/2013 | Molin et al. |
| 8,513,798 B2 | 8/2013 | Otremba |
| 8,837,159 B1 | 9/2014 | Buuck |
| 9,041,070 B2 | 5/2015 | Eguchi et al. |
| 10,312,361 B2 | 6/2019 | Chowdhury et al. |
| 11,006,514 B2 | 5/2021 | Go et al. |
| 11,129,314 B2 | 9/2021 | Grober et al. |
| 2001/0032738 A1 | 10/2001 | Dibene et al. |
| 2002/0149098 A1 | 10/2002 | Seyama et al. |
| 2003/0156400 A1 | 8/2003 | Dibene et al. |
| 2003/0214800 A1 | 11/2003 | Dibene et al. |
| 2004/0021212 A1 | 2/2004 | Hamaguchi et al. |
| 2004/0090755 A1 | 5/2004 | Yatsu |
| 2004/0183193 A1 | 9/2004 | Koide et al. |
| 2004/0203260 A1 | 10/2004 | Block et al. |
| 2005/0051889 A1 | 3/2005 | Wood et al. |
| 2005/0127484 A1 | 6/2005 | Wills |
| 2005/0231929 A1 | 10/2005 | Morita et al. |
| 2005/0248024 A1 | 11/2005 | Costello |
| 2007/0063324 A1 | 3/2007 | Mishiro et al. |
| 2013/0021769 A1 | 1/2013 | Fukuzono |
| 2020/0245464 A1 | 7/2020 | Hattori |

FOREIGN PATENT DOCUMENTS

| | | |
|---|---|---|
| EP | 2627160 A1 | 8/2013 |
| JP | H047865 A | 1/1992 |
| JP | H08274214 A | 10/1996 |
| JP | 2001308258 A | 11/2001 |
| JP | 4609435 B2 | 1/2011 |
| KR | 100258350 B1 | 6/2000 |
| WO | 2000004595 A2 | 1/2000 |
| WO | 2005079125 A1 | 8/2005 |
| WO | 2010096513 A1 | 8/2010 |

OTHER PUBLICATIONS

Multi-layered power module for vertical power delivery applications, Technical Disclosure Commons, (May 6, 2019), pp. 6, https://www.tdcommons.org/dpubs_series/2172.

"Innovating Power Module Packaging" Issue 2, 2021, Power Electronics Europe, pp. 3.

"OCPREG19—Open Accelerator Infrastructure Overview—YouTube" [online] [retrieved Aug. 17, 2022]. Retrieved from the internet: https://www.youtube.com/watch?v=p0H5Z0S1YdY, pp. 2.

* cited by examiner

STRUCTURE FOR OPTIMAL XPU SOCKET COMPRESSION

BACKGROUND

Printed circuit boards ("PCBs") are widely used as hosts for other devices, such as processor packages or application specific integrated circuits ("ASICs"). To enable the installation of those other devices, PCBs can be provided with sockets that align the device and include interfaces for establishing electronic communication between the installed device and the circuitry on the PCB. These interfaces frequently take the form of arrays of pins corresponding to contact pads on the installed device or arrays of contact pads corresponding to pins on the installed device. In either instance, quality and reliability of the communication between the device and the PCB across the interface depend in part on a magnitude of compressive load on the pins. An optimal load on the pins causes the pins to bend against the contact pads, increasing the contact area between the pin and the pad, without damaging any components.

Supporting structures have been developed to compress PCBs and socketed devices together and load the pins. Because processor dies usually benefit from cooling, those supporting structures frequently include a heat sink to be pressed against the top of the socketed device. The compressive load on these supporting structures is typically provided by tensile elements between opposed components on opposite sides of the socketed device. To avoid passing the tensile elements through operative parts of the socketed device, the tensile elements are typically placed at locations laterally spaced away from the contact area between the device and the socket and the contact area between the heat sink and the die.

BRIEF SUMMARY

Lateral space between tensile elements and contact areas tends to create force moments on the compressed components. These moments can greater loading at the edges of the contact areas than at the center and result in warpage. Low load at the center of the socket, for example, can result in under-loaded pins. Arrangements that reduce unevenness in contact pressure on a socket could therefore improve communication between a printed circuit board ("PCB") and a device installed thereon.

Aspects of the present disclosure are directed to a PCB with a socket having pins in a peripheral arrangement. The peripheral arrangement of the pins may result from the pins surrounding a pin less area, such as an aperture that extends through the socket. A processor package mounted to the PCB may therefore only contact pins around a periphery of an area of the processor package that is loaded against the socket. Loads provided by clamping the processor package to the PCB and against the socket may therefore be relatively evenly distributed on the pins.

Further aspects of this disclosure are directed to arrangements for creating a second force couple that compresses a heat sink against a portion of the processor package that is independent of a first force couple that presses the processor package against the socket. The portion of the processor package may be a processor die. The force couples may be parallel. In more specific examples, the force couples may be coaxial. The second force couple may be applied to the processor package through aligned apertures of the socket and components the components that transfer the first force couple to the processor package. For example, the first force couple may be a compressive force between a lid and a bolster plate, and the lid, bolster plate, and PCB may include aligned apertures through which the second force couple is applied to the processor package. The second force couple may be applied to the processor package by objects disposed in or through the aligned apertures, such as the heat sink, which may extend through the aperture of the lid, and a base plate that extends into the aperture of the bolster plate. The portion of the base plate that extends into the aperture of the bolster plate may extend an entire distance to a surface of the processor package, or force may be transferred from the bolster plate to the processor package through a block connected to the processor package and extending into at least the socket aperture.

In another aspect, an assembly may comprise a printed circuit board ("PCB") including an aperture therethrough. The assembly may also comprise an array of pins that extends around a perimeter of the aperture. The assembly may also comprise a processor package extending over the aperture and pressed against the array of pins by a first compressive force couple.

In some examples according to any of the foregoing, the assembly may also comprise a socket that includes the array of pins and a socket board from which the array of pins extends.

In some examples according to any of the foregoing, the socket may lack walls at its periphery.

In some examples according to any of the foregoing, the aperture may be a PCB aperture and the socket board may include a socket aperture extending over the first aperture.

In some examples according to any of the foregoing, the socket board may be bonded to the PCB.

In some examples according to any of the foregoing, the processor package may include a die compressed by a second force couple that is parallel to and independent of the first force couple.

In some examples according to any of the foregoing, the assembly may comprise a base plate and a heat sink. The second force couple may be compression of the die between the base plate and the heat sink.

In some examples according to any of the foregoing, force from the base plate may be transferred to the processor package by an object that extends into the aperture.

In some examples according to any of the foregoing, the assembly may also comprise a bolster plate on an opposite side of the PCB from a lid, wherein the aperture is a PCB aperture. The bolster plate may include a bolster plate aperture aligned with the PCB aperture. The lid may include a lid aperture aligned with the PCB aperture and into which the heat sink extends. The first force couple may be compression of the PCB and the processor package between the lid and the base plate.

In some examples according to any of the foregoing, the assembly may also comprise a block bonded to the processor package and extending into the aperture.

In some examples according to any of the foregoing, the block may be a voltage regulator.

In some examples according to any of the foregoing, the block may be biased toward the processor package.

In some examples according to any of the foregoing, the processor package may include a die, a substrate, and a high speed electrical channel extending from the die across a surface of the board.

In another aspect, an assembly may comprise a PCB, an array of pins that extend from the PCB surrounding a pin less area, a lid, and a processor package clamped between the PCB and the lid. The processor package may include a die, a package board, and a high speed electrical channel extending from the die and along the package board. A high speed electrical connector may be mounted to the package board at an end of the high speed electrical channel.

In some examples according to any of the foregoing, the assembly may comprise a voltage regulator connected to an underside of the processor package extending into an aperture in the PCB.

In some examples according to any of the foregoing, the array of pins may extend around a perimeter of the aperture.

In some examples according to any of the foregoing, the assembly may comprise a heat sink extending through an aperture in the lid to contact the die and a base plate loaded against the heat sink to compress the die.

In some examples according to any of the foregoing, the aperture may be a lid aperture. The PCB may include a PCB aperture. Load on the base plate may be transferred to the processor package by an object disposed through the PCB aperture.

In some examples according to any of the foregoing, the assembly may comprise a bolster plate. The processor package and PCB may be clamped between the bolster plate and the lid.

In some examples according to any of the foregoing, the bolster plate may include a bolster plate aperture aligned with the PCB aperture. Force from the base plate may be transferred to the processor package through the bolster plate aperture and the PCB aperture.

DETAILED DESCRIPTION

All directional terms, such as "up," "down," "above," "below," "vertical," or "height" used in the following description refer only to the orientation of features as depicted in the figure being described. Such directional terms are not intended to suggest that any features of the devices described herein must exist in any particular orientation when constructed.

Figure 1A:
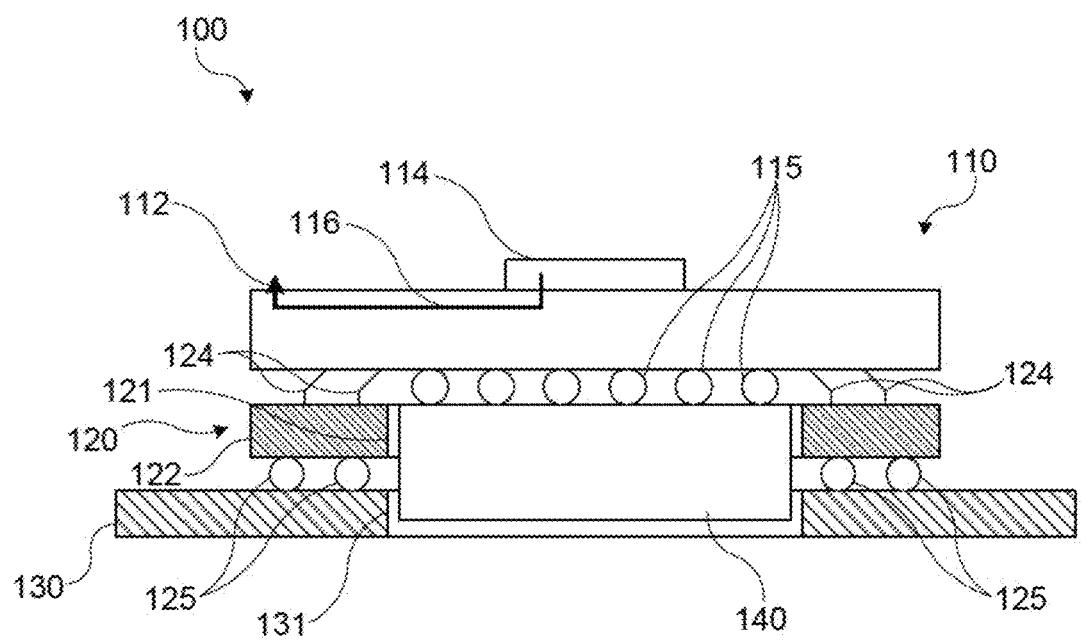
FIG. 1A is a side elevation view of a partial cross section of a first assembly of a processor package and a printed circuit board.

FIG. 1A shows a first assembly 100 that includes a processor package 110 mounted to a printed circuit board ("PCB") 130. Processor package 110 includes a processor die 114 and a package board 112. Package board 112 may be, for example, a substrate supporting die 114. In other examples, package board 112 may be part of a power management system for a processor included in processor package 110, such as a capacitor board. In further examples, package board 112 may be a combination of multiple chips or boards, such as, for example, a substrate on top of a capacitor board. Processor package 110 can contain any type of processor, such as, for example, central processing unit ("CPU"), graphics processing unit ("GPU"), tensor processing unit ("TPU"), or any other type of processing unit which may generically be referred to as an "xPU." Processor package 110 could also be an application specific integrated circuit ("ASIC"). With respect to every reference to a microprocessor package in the present disclosure, the microprocessor package may optionally be an ASIC.

First assembly 110 also contains a socket 120 that enables processor package 110 to be mounted to PCB 130. In the illustrated arrangement, socket 120 includes a socket board 122 from which pins 124 extend in a direction away from PCB 130. Pins 124 are pressed against corresponding pads on an underside of package board 112 to establish an electronic connection therebetween, such as in a land grid array ("LGA") configuration. Socket board 122 is connected to PCB 130 by contacts 125, which may be any type of electrical contact such as, for example, conductive pillars or balls of solder in a ball grid array ("BGA"). In various examples, contacts 125 may mechanically bond socket board 122 to PCB 130 or contacts 125 may merely establish an electrical connection between socket board 122 and PCB 130. In other arrangements, socket 120 may be a portion of PCB 130 from which pins 124 extend instead of a separate socket board 122. Regardless of whether socket 120 is distinct from PCB 130 or a part of PCB 130, socket 120 may optionally lack vertical walls as shown in the illustrated arrangement. In other arrangements, socket 120 may include vertical walls around its periphery that create a concavity in which processor package 110 can be received.

Though pins 124 are part of socket 120 in the illustrated arrangement, in other arrangements pins 124 could instead be part of processor package 110 and may, for example, extend from an underside of package board 112 to press against corresponding pads on socket 120 such as in a pin grid array ("PGA") configuration. In both LGA and PGA configurations, socket 120 and processor package 110 can be pressed onto pins 124 from opposite directions.

Pins 124 are arranged around an area that is free of pins 124 and defined by socket aperture 121. Pins 124 are arranged in an array within which pins 124 are spaced apart from neighboring pins 124 by, in various examples, equal or approximately equal amounts, and the area that is free of pins is an area larger than the space between adjacent pins 124 within the array. The array of pins 124 may have a rectangular outer perimeter with a length and width, and the area that is free of pins may be in the shape of a rectangle that extends across, in various examples, greater than or equal to 60%, 70%, 75%, 80%, 85%, or 90% of a length, width, or length and width of the rectangular outer perimeter of the array of pins 124. The array of pins 124 may extend along two, three, or four sides of the rectangular perimeter. In other examples, either or both of the array of pins and the area that is free of pins may be non-rectangular in shape, and in such other examples the area that is free of pins may be sized to have the same proportions relative to the array of pins as any of the possibilities described above with respect to examples wherein both the array of pins and the area free of pins have rectangular shapes.

In the illustrated example, the area that is free of pins is defined by a socket aperture 121 that extends through socket board 122, though in other examples, the area that is free of pins may simply be a portion of socket 120 that is devoid of pins 124 or pads for contacting pins 124. The presence of pins 124 only along a perimeter of socket 120 contributes to even loading of pins 124 by eliminating pins under the center of package board 112, which would be subject to relatively little load if package board 112 or PCB 130 became warped so that the package board 112 is farther from socket 120 at the center of package board 112 than the edges of package board 112.

High speed electrical channels 116 from die 114 may run across a top surface of package board 112. High speed electrical channels 116 may be, for example, any lines configured to convey information at least at a certain minimum rate, such as, for example, 100 gigabits per second or greater or 200 gigabits per second or greater. In other examples, high speed electrical channels 116 may be lines configured for establishing communication between die 114 and certain high-bandwidth connection types, such as, for example, Ethernet connections or optical communication connections or interfaces. Connections to high speed electrical channel 116 may be made directly from package board 110 instead of elsewhere on PCB 130. Placing high-bandwidth channels 116 on package board 112 this way provides greater flexibility in configuring the shape of socket 120 by avoiding the need for socket 120 to accommodate such high-bandwidth connections. Placing channels 116 on package board 112 also avoids compromises to signal strength and quality that can occur when high bandwidth communications are routed through socket 120 and PCB, though some arrangements other than the illustrated arrangement route even high-bandwidth communications through socket 120 and along PCB 130. Placing channels 116 on package board 112 can also reduce the amount of interface area needed between processor package 110 and socket 120.

First assembly 100 also includes a block 140 connected to an underside of processor package 110. Block 140 may be any object, though in some examples, block 140 is part of a power management system for processor package 110. The power management system may be, for example, a voltage regulator or a vertical power module. Block 140 can be connected to processor package 110 in any manner, such as by contacts 115. Like contacts 125, contacts 115 may be any type of electrical contact such as, for example, conductive pillars or balls of solder in a BGA. In other examples, block 140 could be omitted altogether.

Figure 1B:
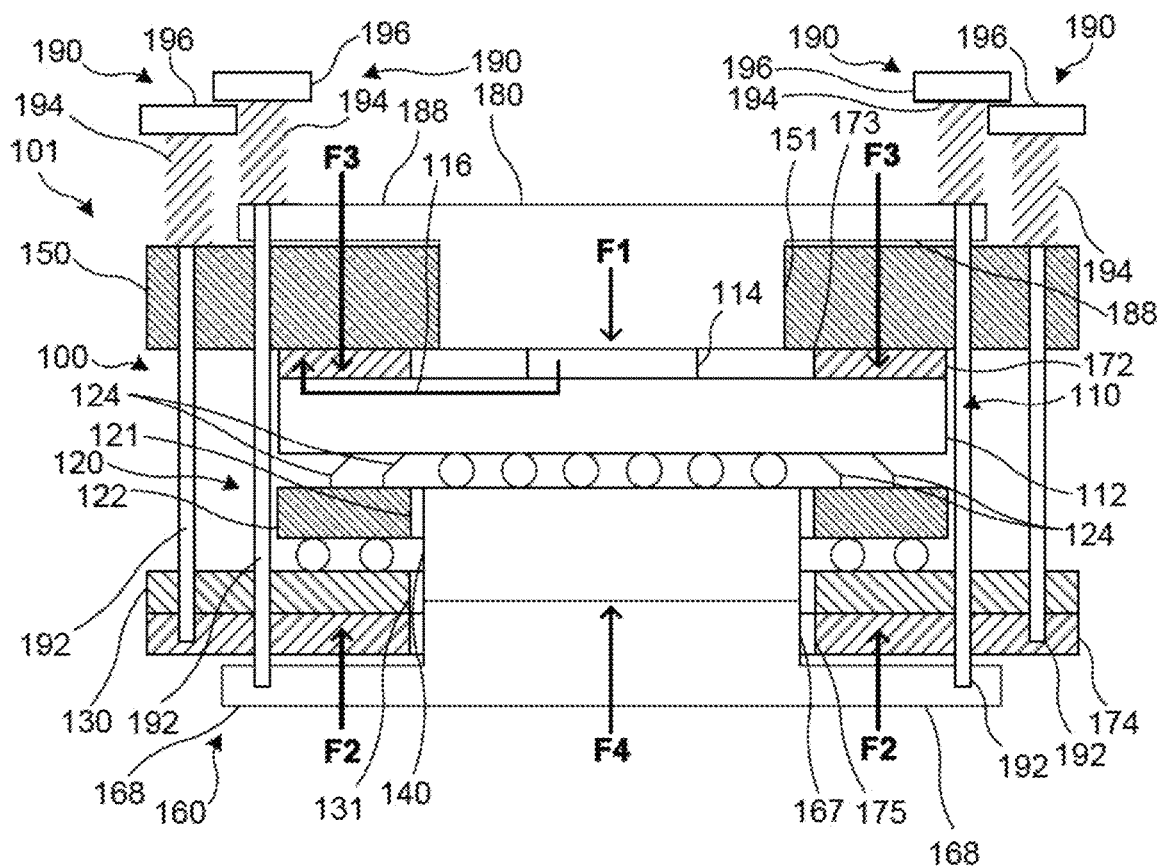
FIG. 1B is a side elevation view of a partial cross-section of a second assembly that includes the first assembly.

As shown in FIG. 1B, a second assembly 101 includes first assembly 100 and presses processor package 110 and socket 120 together 124 with clamping forces F2 and F3. Clamping forces F2, F3 are a force couple resulting from the compression of first assembly 100 between a lid 150 and a bolster plate 174 of second assembly 101. Load cells 190 connect lid 150 and base plate 160 together and draw lid 150 and base plate 160 toward one another, thereby creating clamping forces F2, F3.

The illustrated example of second assembly 101 also includes a reinforcement plate 172 positioned on top of package board 112. Reinforcement plate 172 acts to provide structural support to package board 112 and to narrow the area across which F2 is applied to package board 112. Reinforcement plate 172 includes a reinforcement plate aperture 173 and has a footprint similar in shape and size to the area of socket 120 that includes pins 124. Force F2 as applied to package board 112 through reinforcement plate 172 is therefore laterally horizontally aligned with the support to the underside of package board 112 provided by socket 120. This horizontal alignment of force F2 with socket 120 avoids creating a force moment on package board 112 and results in relatively even load on all pins 124. In arrangements other than the illustrated arrangement, reinforcement plate 172 could be shaped and sized differently or omitted altogether.

Second assembly 101 also includes a heat sink 180 and a base plate 160 that create clamping forces F1 and F4. Clamping forces F1, F4 are a separate force couple from F2, F3. Clamping forces F1, F4 result from load cells 190 pulling heat sink 180 and base plate 160 together to load heat sink 180 onto die 114. Heat sink 180 extends within lid aperture 151 to apply F1 to die 114, and base plate 160 includes a platform 167 extending into at least bolster plate aperture 175 to apply F4 to an underside of package board 112 in opposition to F1. In the illustrated example, force F4 is applied through block 140, but in other examples force F4 could be applied directly from platform 167 to package board 112. Platform is shown extending through bolster plate aperture 175 and into PCB aperture 131 while block 122 extends through socket aperture 121 into PCB aperture 131, but the height of platform 167 and the thickness of block 140 can both vary, and the height of platform 167 can be adjusted or designed in any instance to extend as far into bolster plate aperture 175, PCB aperture 131, and socket aperture 120 as necessary to cooperate with any thickness of block 140 to apply an appropriate load to the underside of processor package 110. The presence of a block 140 on an underside of processor package 110 and having enough thickness to extend into socket aperture 121 and PCB aperture 131 can assist with aligning processor package 110 over socket 120, reducing or eliminating the need for any vertical walls around socket 120 to guide processor package 110.

Because heat sink 180 and base plate 160 are loaded by different load cells 190 than lid 150 and bolster plate 174 and because heat sink 180 and base plate 160 are movable relative to lid 150 and bolster plate 174, the force couple of F1 and F4 is independent from the force couple of F2 and F3. The contact pressure between heat sink 180 and die 114 can therefore be adjusted independently of the compressive force applied to pins 124. This ability to adjust the F2, F3 force couple independently of the F1, F4 force couple means loads between heat sink 180 and die 114 and loads on pins 124 can be optimized without concern for over- or under-loading the other. In other arrangements, heat sink 180 may be positionally fixed relative to lid 150 or base plate 160 may be positionally fixed relative to or integrated with bolster plate 174. In such other arrangements, the magnitude of forces F1, F4 can be adjusted independently of forces F2, F3 as long as either or both heat sink 180 is vertically movable relative to lid 150 or base plate 160 is vertically movable relative to bolster plate 174.

Load cells 190 of the illustrated example each include a spring 194 and a screw 192 having a head 196 against which spring 194 is trapped. Screw 192 of each load cell 190 that includes a spring 194 trapped against the upper side of lid 150 is threadedly engaged with bolster plate 174. Threadedly advancing screws 192 of those load cells 190 into bolster plate 174 increases the pressure on the corresponding springs 194 and thereby increases forces F2, F3. Similarly, screw 192 of each load cell 190 that includes a spring 194 trapped against the upper side of heat sink 180 is threadedly engaged with base plate 160, so threadedly advancing screws 192 of those load cells 190 into base plate 160 increases forces F1, F4. Load cells 190 according to other examples can be any other device capable of pulling components of second assembly 101 together.

Heat sink 180 may include laterally extending sink flanges 188 and base plate 160 may include laterally extending base flanges 168 as shown. Sink flanges 188 are thinner than a main body of heat sink 180 that extends into lid aperture 151 to contact die 114. Similarly, base flanges 168 are thinner than platform 167 that extends into at least bolster plate aperture 175 to load the underside of processor package 110. The different thicknesses and lateral extend of flanges 168, 188 enables load cells 190 to engage base plate 160 and heat sink 180 at locations laterally offset from the relatively narrow areas where platform 167 and the main body of heat sink 180 transfer that load to other components in the form of forces F1, F4.

Figure 2A:
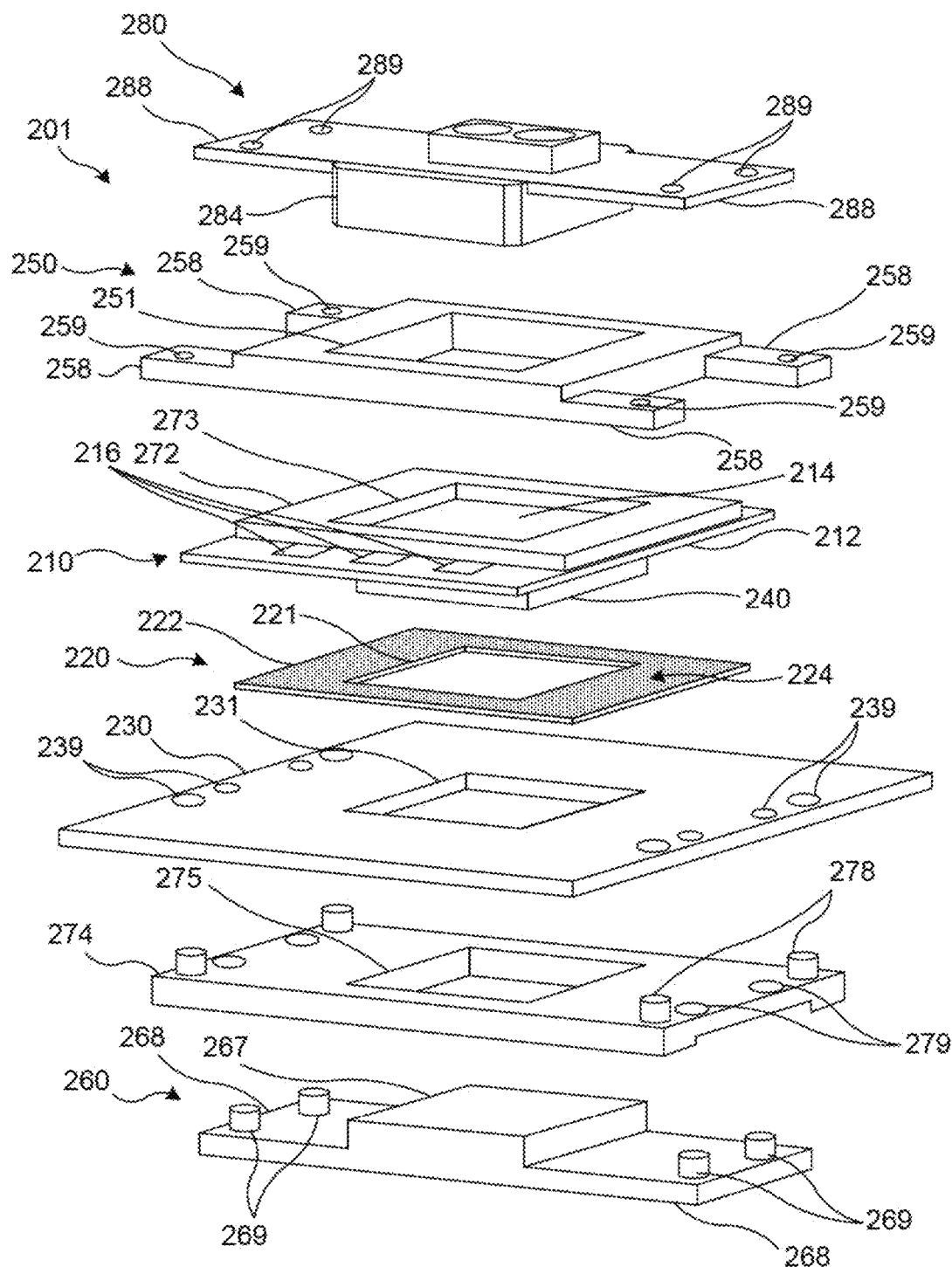
FIG. 2A is an exploded perspective view of a third assembly.
Figure 2B:
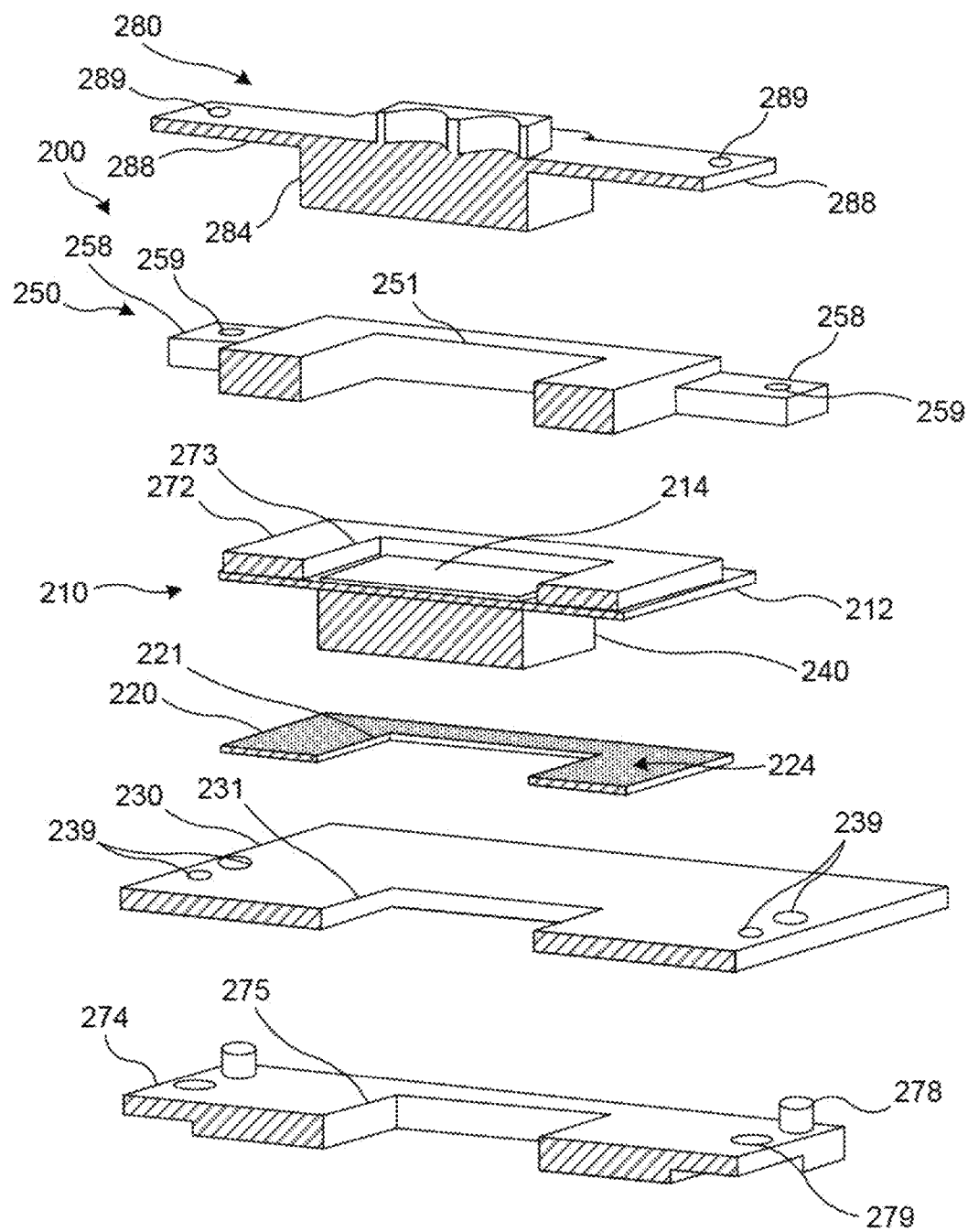
FIG. 2B is a cross-sectional view of a portion of the third assembly.
Figure 2C:
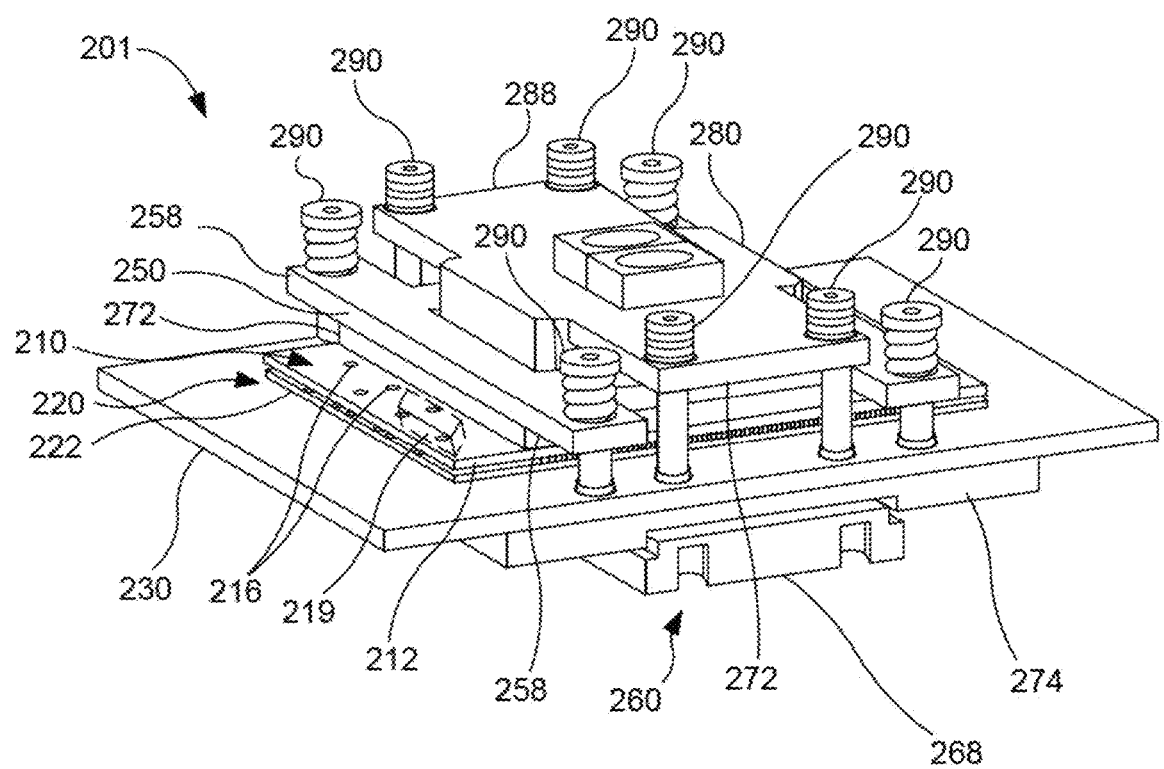
FIG. 2C is a perspective view of the third assembly in an assembled state.

FIGS. 2A and 2C show an assembly 201, and FIG. 2B shows the components of assembly 201 except for a base plate 260 in cross-section. Elements of assembly 201 are alike to like numbered elements of second assembly 101, meaning that processor package 210 is alike to processor 110, heat sink 280 is alike to heat sink 180, and so on, except for specifically described or illustrated differences. Accordingly, certain elements of assembly 201 enumerated in the figures may not be specifically mentioned in the present description.

Heat sink 280 include holes 289 through sink flanges 288. The holes 289 in the pair of holes 289 in each sink flange 288 are separated by a distance smaller than a distance between tabs 258 of lid 250. Load cells 290 (not pictured in FIG. 2A or 2B) applied to the top of sink flanges 280 can therefore extend downward through holes 289 and between tabs 258 without contacting lid 250. However, in other examples without spaced apart tabs 258, lid 250 could be provided with additional holes to enable heat sink's 280 load cells 290 to pass through lid 250 without affecting lid 250.

Tabs 258 also include holes 259 so that additional load cells 290 can be placed atop tabs 258 to extend through holes 259 and load lid 250. PCB 230 includes holes 239 extending therethrough to allow the load cells 290 atop heat sink 280 and lid 250 to pass through PCB 230 without loading PCB 230.

Bolster plate 270 includes internally threaded standoffs 278 to accept threaded ends of screws of the load cells 290 applied to the top of lid 250. The load cells 290 atop lid 250 can therefore extend past reinforcement plate 272, processor package 210, and socket 220 and through PCB 230 to reach and engage bolster plate 274. The lid's 250 load cells 290 can thus draw lid 250 and bolster plate 274 together, thereby creating a clamping force couple that compresses reinforcement plate 272, package board 212, socket 220, and PCB 230. Because die 214 is located in reinforcement plate aperture 273 and pins 224 surround a socket aperture 221 of equal or approximately equal dimensions to reinforcement plate aperture 273, this compression loads pins 274 between socket 220 and an underside of package board 212 without compressing die 214.

Bolster plate 274 also includes holes 279 to enable the load cells 290 disposed through holes 289 of heat sink to pass through bolster plate 274 and reach base plate 260 without loading bolster plate 274. In other examples, instead of including holes 279 bolster plate 274 could include tabs, similar to tabs 258, on which standoffs 278 could be located and between which the heat sink's 280 load cells 290 could pass.

Base plate 260 includes internally standoffs 269 aligned under holes 279 to accept threaded ends of screws of the load cells 290 applied to the top of heat sink 280. The load cells 290 atop heat sink 280 can therefore extend past lid 250, reinforcement plate 272, processor package 210, and socket 220 and through PCB 230 and bolster plate 274 to reach and engage base plate 260. The heat sink's 280 load cells 290 can thus draw heat sink 280 and base plate 260 together, thereby creating a clamping force couple that presses a body 284 of heat sink 280 into contact with die 214. A total height of body 284, processor package 210, block 240, and platform 267 exceeds a total height of the portions of lid 250, reinforcement plate 272, package board 212, socket 220, PCB 230, and bolster plate 274 located between flanges 288 and 268, so the force applied by load cells 290 to draw heat sink 280 and base plate 260 together does not compress pins 224.

In the illustrated example, standoffs 269, 278 are raised posts with internally threaded holes extending therethrough. Because standoffs 269, 278 are raised, they can extend into overlying holes 279, 239 to align components of assembly 201 as they are stacked together. However, alternative arrangements could replace standoffs 269, 278 with internally threaded holes or unthreaded holes provided with internally threaded nuts to load the undersides of bolster plate 274 and base plate 260. Still further variations could be made as appropriate in arrangements where loading devices other than screw and spring load cells 290 are used.

When assembly 201 is stacked together as shown in FIG. 2C, high speed channels 216 on the top side of package board 212 are exposed and therefore accessible. High speed channels 216 can therefore be fitted with suitable high speed connectors 219, such as, for example, Ethernet ports, optical communication modules, or any other electronic connector.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. An assembly, comprising:
    a printed circuit board ("PCB") including an aperture therethrough;
    an array of pins that extends around a perimeter of the aperture;
    a processor package extending over the aperture and pressed against the array of pins by a first compressive force couple; and
    a socket that includes the array of pins and a socket board from which the array of pins extends.

2. The assembly of claim 1, wherein the socket lacks walls at its periphery.

3. The assembly of claim 1, wherein the aperture is a PCB aperture and the socket board includes a socket aperture extending over the first aperture.

4. The assembly of claim 1, wherein the socket board is bonded to the PCB.

5. The assembly of claim 1, wherein the processor package includes a die, a substrate, and a high speed electrical channel extending from the die across a surface of the board.

6. The assembly of claim 1, comprising a block bonded to the processor package and extending into the aperture.

7. The assembly of claim 6, wherein the block is a voltage regulator.

8. The assembly of claim 7, wherein the block is biased toward the processor package.

9. The assembly of claim 1, wherein the processor package includes a die compressed by a second force couple that is parallel to and independent of the first force couple.

10. The assembly of claim 9, comprising a base plate and a heat sink, wherein the second force couple is compression of the die between the base plate and the heat sink.

11. The assembly of claim 10, wherein force from the base plate is transferred to the processor package by an object that extends into the aperture.

12. The assembly of claim 11, comprising a bolster plate on an opposite side of the PCB from a lid, wherein the aperture is a PCB aperture, the bolster plate includes a bolster plate aperture aligned with the PCB aperture, and the lid includes a lid aperture aligned with the PCB aperture and into which the heat sink extends, and the first force couple is compression of the PCB and the processor package between the lid and the base plate.

13. An assembly, comprising:
a PCB;
an array of pins that extend from the PCB surrounding an area that is free of pins;
a lid;
a processor package clamped between the PCB and the lid, the processor package including a die, a package board, and a high speed electrical channel extending from the die and along the package board; and
a high speed electrical connector mounted to the package board at an end of the high speed electrical channel.

14. The assembly of claim 13, comprising a heat sink extending through an aperture in the lid to contact the die and a base plate loaded against the heat sink to compress the die.

15. The assembly of claim 13, comprising a voltage regulator connected to an underside of the processor package extending into an aperture in the PCB.

16. The assembly of claim 15, wherein the array of pins extends around a perimeter of the aperture.

17. The assembly of claim 13, wherein the aperture is a lid aperture, the PCB includes a PCB aperture, and load on the base plate is transferred to the processor package by an object disposed through the PCB aperture.

18. The assembly of claim 17, comprising a bolster plate, wherein the processor package and PCB are clamped between the bolster plate and the lid.

19. The assembly of claim 18, wherein the bolster plate includes a bolster plate aperture aligned with the PCB aperture and force from the base plate is transferred to the processor package through the bolster plate aperture and the PCB aperture.

* * * * *